(12) United States Patent
Ito (10) Patent No.: US 11,525,860 B2
(45) Date of Patent: Dec. 13, 2022

(54) RELAY FAILURE DETECTION CIRCUIT AND ROBOT

(71) Applicant: SEIKO EPSON CORPORATION, Tokyo (JP)

(72) Inventor: Motoki Ito, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/327,802

(22) Filed: May 24, 2021

(65) Prior Publication Data

US 2021/0364572 A1 Nov. 25, 2021

(30) Foreign Application Priority Data

May 25, 2020 (JP) .............. JP2020-090270

(51) Int. Cl.
*G01R 31/327* (2006.01)
*B25J 19/00* (2006.01)
*H02P 27/06* (2006.01)

(52) U.S. Cl.
CPC ...... *G01R 31/3278* (2013.01); *B25J 19/0095* (2013.01); *H02P 27/06* (2013.01)

(58) Field of Classification Search
CPC .................................................. G01R 31/327
See application file for complete search history.

(56) References Cited

U.S. PATENT DOCUMENTS

| 5,841,257 | A  | * | 11/1998 | Hashimoto | ............ | B25J 9/1674 |
|           |    |   |         |           |              | 318/434 |
| 7,557,583 | B2 | * | 7/2009  | Zettel    | ................. | G01R 31/3278 |
|           |    |   |         |           |              | 324/421 |
| 9,182,446 | B2 | * | 11/2015 | Liu       | ..................... | G01R 19/0038 |
| 9,711,309 | B2 | * | 7/2017  | McCormick | ......... | H01H 47/226 |
| 2014/0183958 | A1 | * | 7/2014 | Yeh   | .......................... | H02J 9/062 |
|           |    |   |         |           |              | 307/66 |

FOREIGN PATENT DOCUMENTS

JP 2006119995 A 5/2006

* cited by examiner

*Primary Examiner* — Walter L Lindsay, Jr.
*Assistant Examiner* — Milton Gonzalez
(74) *Attorney, Agent, or Firm* — Yu Gang (57) ABSTRACT

A relay failure detection circuit includes a first voltage acquiring section configured to acquire an AC voltage input to a power supply circuit and output the AC voltage as a first voltage signal, a second voltage acquiring section configured to acquire an inter-terminal voltage of a relay provided in the power supply circuit and output the inter-terminal voltage as a second voltage signal, a comparing section configured to compare a waveform of the first voltage signal and a waveform of the second voltage signal, and a determining section configured to determine a failure of the relay according to a result of the comparison.

9 Claims, 10 Drawing Sheets

| STATES OF RLa, RLb | RLa | RLb | DSa | DSb |
|---|---|---|---|---|
| RLa, RLb NORMAL | OPEN | OPEN | PULSE | PULSE |
| RLa SHORT-CIRCUITED, RLb NORMAL | CLOSED | OPEN | FIXED | PULSE |
| RLa NORMAL, RLb SHORT-CIRCUITED | OPEN | CLOSED | PULSE | FIXED |
| RLa, RLb SHORT-CIRCUITED | CLOSED | CLOSED | FIXED | FIXED |

SRa, SRb OPEN

FIG. 11

RELAY FAILURE DETECTION CIRCUIT AND ROBOT

The present application is based on, and claims priority from JP Application Serial Number 2020-090270, filed May 25, 2020, the disclosure of which is hereby incorporated by reference herein in its entirety.

BACKGROUND

1. Technical Field

The present disclosure relates to a relay failure detection circuit and a robot.

2. Related Art

An industrial robot includes an emergency stop circuit that immediately cuts off supply of electric power, which is an energy source to a motor functioning as a power source, at an emergency stop time. As means for cutting off the electric power at the emergency stop time, there is, for example, means for setting a relay provided in a supply line for AC power to an open state. In the relay provided in the supply line for the electric power, a failure that prevents the relay from changing to the open state is likely to occur because of welding of a contact. Accordingly, it is desired to detect a relay failure due to welding (hereinafter referred to as "welding failure" as well). A technique for detecting the welding failure of the relay is disclosed in JP-A-2006-119995 (Patent Literature 1).

The detection of the welding failure described in Patent Literature 1 alternately turns on and off relays of duplexed emergency stop circuits according to opening and closing control signals of energization switches of the relays and compares voltage signals of relay contacts of the relays to thereby detect which relay contact is fused.

However, in the welding detection disclosed in Patent Literature 1, the on and off of at least one of the energization switches is repeated twice. Since the relays are mechanical contacts, if the life of the relays is considered, it is desired to detect a failure of the relays by turning on and off the relays as small a number of times as possible.

SUMMARY

According to an aspect of the present disclosure, there is provided a relay failure detection circuit. The relay failure detection circuit includes: a first voltage acquiring section configured to acquire an AC voltage input to a power supply circuit and output the AC voltage as a first voltage signal; a second voltage acquiring section configured to acquire an inter-terminal voltage of a relay provided in the power supply circuit and output the inter-terminal voltage as a second voltage signal; a comparing section configured to compare waveforms of the first voltage signal and the second voltage signal; and a determining section configured to determine a failure of the relay according to a result of the comparison of the waveforms.

DESCRIPTION OF EXEMPLARY EMBODIMENTS

A. First Embodiment

Figure 1:
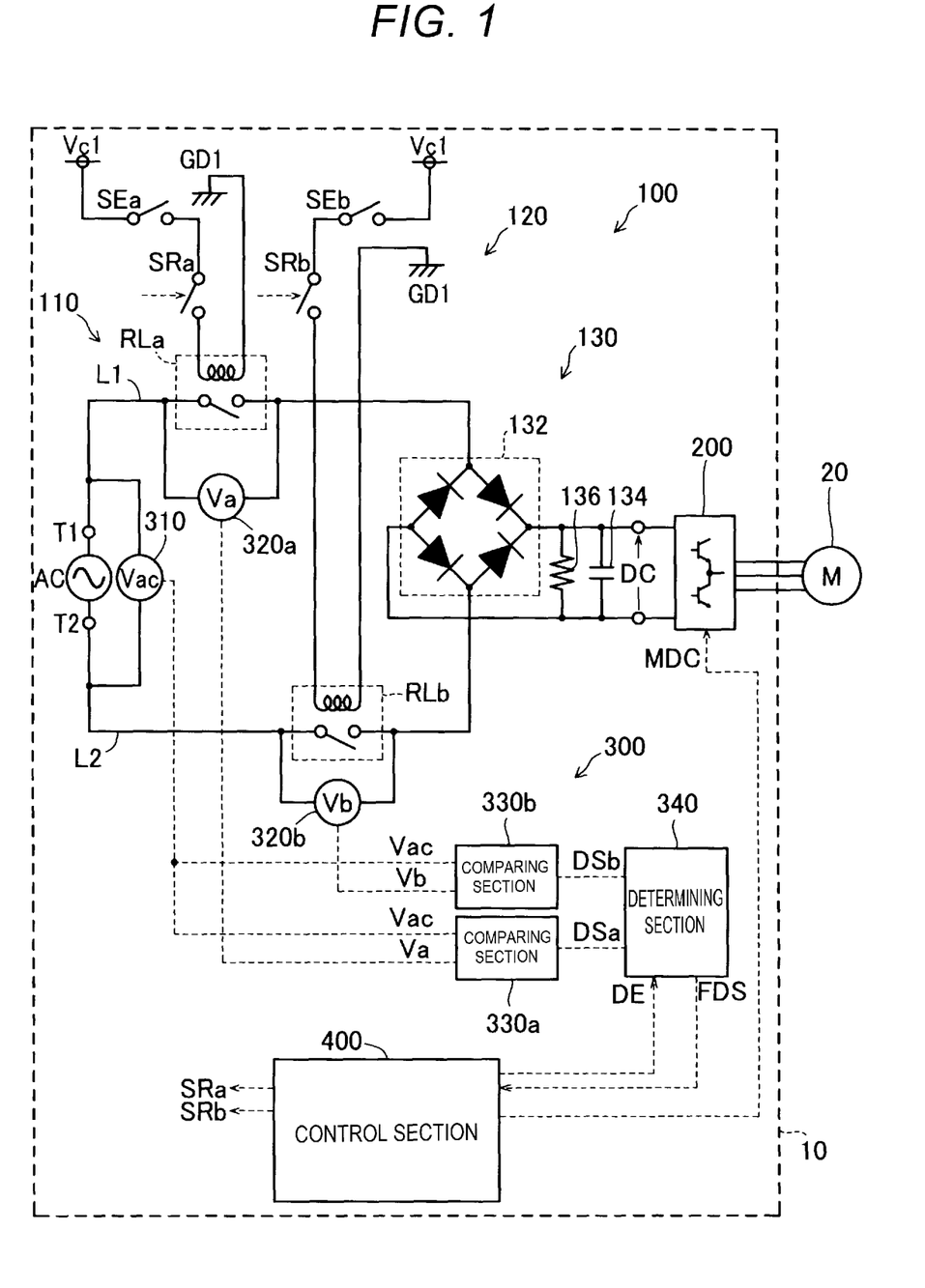
FIG. 1 is a schematic configuration diagram of a control device including a relay failure detection circuit in a first embodiment.

FIG. 1 is a schematic configuration diagram of a control device 10 including a relay failure detection circuit 300 in a first embodiment. The control device 10 is shown as an example of a control device that controls driving of a motor 20. The control device 10 includes a power supply circuit 100, a driving circuit 200 for the motor 20, the relay failure detection circuit 300, and a control section 400.

The power supply circuit 100 includes an AC input circuit 110, an emergency stop circuit 120, a rectifier circuit 130. The AC input circuit 110 includes a pair of AC lines L1 and L2 for supplying, to the rectifier circuit 130, an AC voltage AC input from an AD power supply coupled to a pair of input terminals T1 and T2. Relays RLa and RLb that cut off the supply of the AC voltage AC to the rectifier circuit 130 are provided in the AC lines L1 and L2. Opening and closing of the relays RLa and RLb is controlled by the emergency stop circuit 120 explained below.

The rectifier circuit 130 includes a bridge diode 132, a smoothing capacitor 134, and a discharge resistor 136. The rectifier circuit 130 rectifies the AC voltage AC with the bridge diode 132, smooths the AC voltage AC with a smoothing circuit configured by the smoothing capacitor 134 and the discharge resistor 136, and converts the AC voltage AC into a DC voltage DC. The DC voltage DC is supplied to the driving circuit 200.

The driving circuit 200 converts, according to a control signal MDC supplied from the control section 400, the supplied DC voltage DC into a driving voltage for the motor 20 and supplies the driving voltage to the motor 20. Consequently, the motor 20 is driven by the supplied driving voltage.

The emergency stop circuit 120 includes a first emergency stop switch SEa and a first power switch SRa for the first relay RLa and includes a second emergency stop switch SEb and a second power supply switch SRb for the second relay RLb. A first emergency stop switch SEa, a first power supply switch SRa, and a coil of the first relay RLa are coupled in series between a ground GD1 of the emergency stop circuit 120 and a DC voltage Vc1. The second emergency stop switch SEb, the second power switch SRb, and a coil of the second relay RLb are also coupled in series between the ground GD1 and the DC voltage Vc1. The DC voltage Vc1 and the ground GD1 are generated in a not-shown power supply circuit using the AC voltage AC supplied from the input terminals T1 and T2.

The emergency stop switches SEa and SEb are switches that change to an open state, for example, when an emergency stop button (not shown) is pressed by an operator during abnormality occurrence and are switches that are usually maintained in a closed state. The power supply switches SRa and SRb are switches that are usually maintained in the open state and are switches that change to the closed state, for example, when a power button is pressed and a control signal is supplied from the control section 400. The power switches SRa and SRb are equivalent to energization switches for supplying electric power to the coils of the relays RLa and RLb. The power switches SRa and SRb change to the closed state, whereby the coils of the relays RLa and RLb are energized and switches of the relays RLa and RLb change to the closed state. The switches of the relays RLa and RLb change to the closed state, whereby the AC voltage AC is supplied to the rectifier circuit 130 and the DC voltage DC is supplied to the driving circuit 200. Consequently, power supply to the motor 20 by the driving circuit 200 is performed and driving of the motor 20 is executed.

The relay failure detection circuit 300 includes an AC-voltage acquiring section 310 equivalent to the first voltage acquiring section, a pair of relay-voltage acquiring sections 320a and 320b equivalent to the second voltage acquiring section, a pair of comparing sections 330a and 330b, and a determining section 340.

The AC-voltage acquiring section 310 is provided in parallel to an AC power supply coupled between a pair of input terminals T1 and T2. The AC-voltage acquiring section 310 acquires an AC voltage input from the pair of input terminals T1 and T2 and outputs the AC voltage as an AC voltage signal Vac.

The first relay-voltage acquiring section 320a is provided in parallel to the first relay RLa. The second relay-voltage acquiring section 320b is provided in parallel to the second relay RLb. The first relay-voltage acquiring section 320a acquires an inter-terminal voltage of the first relay RLa and outputs the inter-terminal voltage as a first inter-relay terminal voltage signal Va. The second relay-voltage acquiring section 320b acquires an inter-terminal voltage of the second relay RLb and outputs the inter-terminal voltage as a second inter-relay terminal voltage signal Vb.

The first comparing section 330a compares a waveform of the AC voltage signal Vac and a waveform of the first inter-relay terminal voltage signal Va and outputs a comparison result as a first comparison signal DSa. The second comparing section 330b compares a waveform of the AC voltage signal Vac and a waveform of the second inter-relay terminal voltage signal Vb and outputs a comparison result as a second comparison signal DSb.

The AC voltage signal Vac is equivalent to the first voltage signal. The first inter-relay terminal voltage signal Va and the second inter-relay terminal voltage signal Vb are equivalent to the second voltage signal.

In a determination permission period set according to a determination permission signal DE supplied from the control section 400, the determining section 340 determines presence or absence of a failure of the first relay RLa according to the first comparison signal DSa and determines presence or absence of a failure of the second relay RLb according to the second comparison signal DSb. The determining section 340 is configured by a dedicated logic circuit that realizes these determination functions. The determination permission period only has to be set at, for example, a preset fixed interval. Consequently, compared with when the determination is always performed, it is possible to reduce a load applied to the determining section 340, achieve power saving of the relay failure detection circuit, and achieve power saving of the device. However, not only this, but the determination may be always performed.

The control section 400 controls the power switches SRa and SRb according to a determination signal FDS indicating a determination result supplied from the determining section 340. Specifically, irrespective of a pressing state of the power button by the operator, the control section 400 controls the second power switch SRb to change to the open state when it is determined that a failure has occurred in the first relay RLa and controls the first power switch SRa to change to the open state when it is determined that a failure has occurred in the second relay RLb. The control section 400 is configured by a computer including, for example, a CPU (Central Processing Unit), a ROM (Read Only Memory), a RAM (Random Access Memory), and an input and output interface.

Like the control section 400, the determining section 340 configured by the dedicated logic circuit may be configured by a computer. The determining section 340 may be incorporated in the control section 400.

Figure 2:
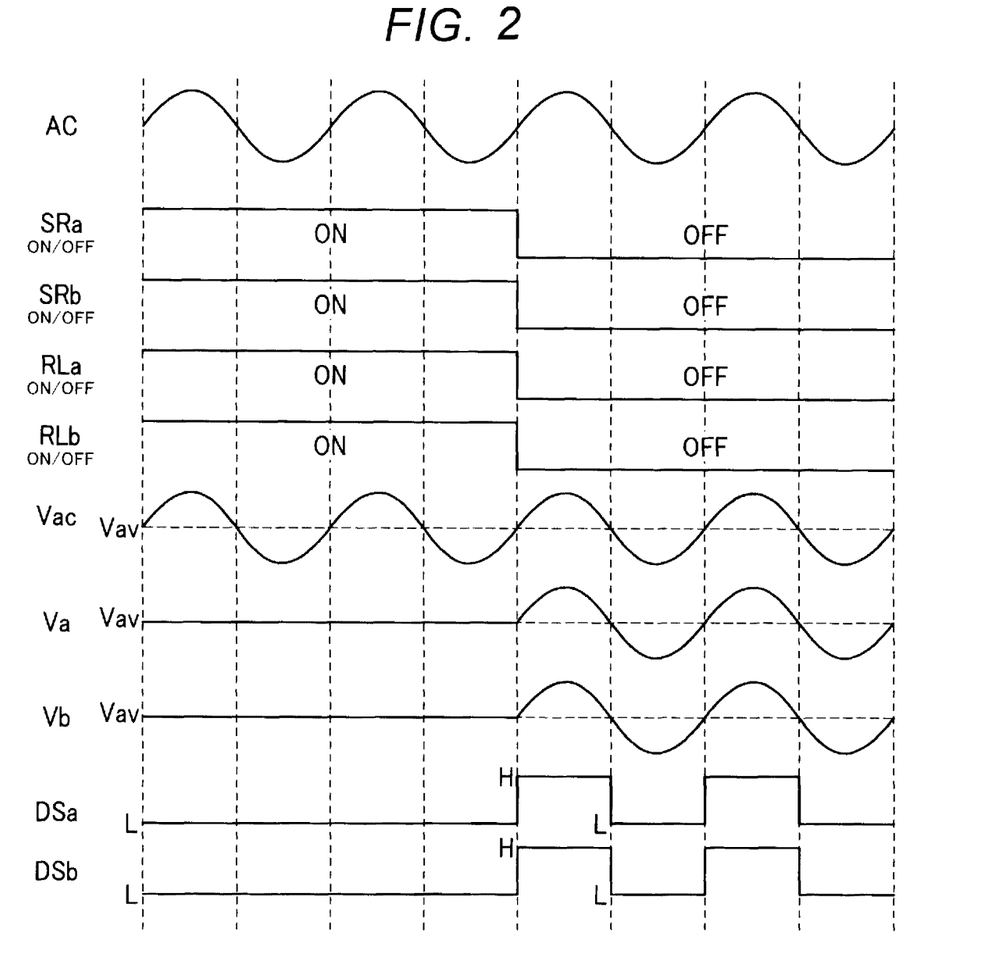
FIG. 2 is an explanatory diagram showing an AC voltage signal, inter-relay terminal voltage signals, and comparison signals.

FIG. 2 is an explanatory diagram showing the AC voltage signal Vac, the inter-relay terminal voltage signals Va and Vb, and the comparison signals DSa and DSb. The AC voltage signal Vac acquired by the AC-voltage acquiring section 310 changes in synchronization with a cycle change of the AC voltage AC irrespective of whether the power switches SRa and SRb are in the closed state (ON) and the relays RLa and RLb are in the closed state (ON) or the power switches SRa and SRb are in the open state (OFF) and the relays RLa and RLb are in the open state (OFF). Vav indicates a median of an AC voltage that cyclically changes.

In contrast, the inter-relay terminal voltage signals Va and Vb acquired by the relay-voltage acquiring section 320a and 320b are different depending on whether the relays RLa and RLb are in the open state or the closed state.

When the relays RLa and RLb are in the closed state, since a potential difference between the relay terminals does not occur, the inter-relay terminal voltage signals Va and Vb have a fixed value. The fixed value is usually a value Vav that is the same as a median of a voltage that cyclically changes, for example, a median of the AC voltage signal Vac. When the relays RLa and RLb are in the open state, the inter-relay terminal voltage signals Va and Vb cyclically change like the AC voltage signal Vac. However, the voltage amplitude of the inter-relay terminal voltage signals Va and Vb is approximately a half compared with the volage amplitude of the AC voltage signal Vac. When one of relays RLa and RLb is in the open state and the other of the relays RLb and RLa is in the closed state, the amplitude of the inter-relay terminal voltage signals Va and Vb is approximately the same as the amplitude of the AC voltage signal Vac. That is, when the relays RLa and RLb corresponding to the inter-relay terminal voltage signals Va and Vb are in the open state, the inter-relay terminal voltage signals Va and Vb are signals that cyclically change at half amplitude to the same amplitude with respect to the amplitude of the AC volage signal Vac.

Therefore, when the relays RLa and RLb are in the open state, the inter-relay terminal voltage signals Va and Vb have the amplitude different from the amplitude of the AC voltage signal Vac but change coincidentally with the cyclic change of the AC voltage signal Vac. When the relays RLa and RLb are in the closed state, the inter-relay terminal voltage signals Va and Vb have the fixed value Vav.

The first comparing section 330a outputs the first comparison signal DSa corresponding to the comparison result of the AC voltage signal Vac and the first inter-relay terminal voltage signal Va. As explained above, when the first relay RLa is in the open state, if a difference due to the difference between the amplitude of the AC voltage signal Vac and the first inter-relay terminal voltage signal Va is neglected, the AC voltage signal Vac and the first inter-relay terminal voltage signal Va are signals that cyclically change coincidentally with each other. In this case, the first comparing section 330a outputs, as the first comparison signal DSa, a pulse signal that changes in synchronization with the cyclic change of the AC voltage signal Vac. In contrast, when the first relay RLa is in the closed state, the first inter-relay terminal voltage signal Va has the fixed value Vav and the difference between the AC voltage signal Vac and the first inter-relay terminal voltage signal Va is larger than the neglected difference described above. In this case, the first comparing section 330a outputs, as the first comparison signal DSa, a signal fixed to a fixed level, in this example, an L level. By comparing a predetermined threshold and the difference between the AC voltage signal Vac and the first inter-relay terminal voltage signal Va, it is possible to neglect the difference due to the difference in the amplitude in the open state of the first relay RLa and detect a large difference in the closed state of the first relay RLa.

Like the first comparing section 330a, when the second relay RLb is in the open state, the second comparing section 330b outputs, as the second comparison signal DSb, a pulse signal that changes in synchronization with the cyclic change of the AC voltage signal Vac and, when the second relay RLb is in the closed state, the second comparing section 330b outputs a signal fixed to a fixed level as the second comparison signal DSb.

It is seen that, when the first power switch SRa is in the open state and the first inter-relay terminal voltage signal Va has the fixed value and the first comparison signal DSa is a fixed signal, the switch of the first relay RLa that should be in the open state is in the closed state. Similarly, it is seen that, when the second power switch SRb is in the open state and the second inter-relay terminal voltage signal Vb has the fixed value and the second comparison signal DSb is a fixed signal, the switch of the second relay RLb that should be in the open state is in the closed state.

Therefore, the determining section 340 can determine a short-circuit failure of the first relay RLa from a state of the first comparison signal DSa at the time when the first relay RLa is set to the open state. Similarly, the determining section 340 can determine a short-circuit failure of the second relay RLb from a state of the second comparison signal DSb at the time when the second relay RLb is set to the open state. As the short-circuit failures of the relays RLa and RLb, for example, a short-circuit failure due to contact welding and a short-circuit failure due to foreign matters are conceivable.

Figure 3:
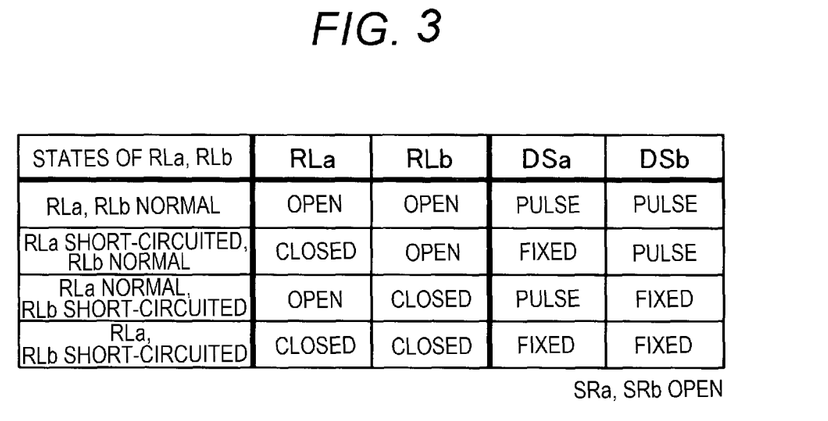
FIG. 3 is a table showing an example of a pattern of determination by a determining section.

FIG. 3 is a table showing an example of a pattern of determination by the determining section 340. When the first comparison signal DSa and the second comparison signal DSb are pulse signals, it is determined that the first relay RLa and the second relay RLb are normal. When only the first comparison signal DSa is a fixed signal, it is determined that a short-circuit failure has occurred in the first relay RLa and the second relay RLb is normal. When only the second comparison signal is a fixed signal, it is determined that the first relay RLa is normal and a short-circuit failure has occurred in the second relay RLb. When the first comparison signal DSa and the second comparison signal DSb are fixed signals, it is determined that short-circuit failures have occurred in the first relay RLa and the second relay RLb. The determination by the determining section 340 is executed when the power switches SRa and SRb are in the open state and the determination is permitted by the determination permission signal DE.

The determining section 340 outputs a result of the failure determination to the control section 400 as the determination signal FDS. The control section 400 controls the operation of the power supply circuit 100 according to the result of the failure determination supplied by the determination signal FDS. For example, when both of the relays RLa and RLb are normal, the control section 400 executes normal operation control. When it is determined that a short-circuit failure has occurred in one of the relays RLa and RLb, the control section 400 controls to fix switching of the power switch corresponding to the other relay in the open state such that the other relay cannot be set to the closed state. Consequently, it is possible to cut off the power supply from the power supply circuit 100 to the driving circuit 200.

As explained above, in the relay failure detection circuit 300 in the first embodiment, when the power switches SRa and SRb are set to the open state and the relays RLa and RLb are set to the open state, it is possible to determine short-circuit failures of the relays RLa and RLb by comparing the waveform of the AC voltage signal Vac and the waveforms of the inter-relay terminal voltage signals Va and Vb. Consequently, when the relays are set to the open state, it is possible to determine short-circuit failures of the relays without performing switching of the setting. When the relays are set to the closed state, it is possible to determine short-circuit failures of the relays by switching the setting of the relays from the closed state to the open state once. Therefore, it is possible to determine short-circuit failures of the relays in a smaller number of times of switching of the relays compared with the related art, that is, while suppressing a decrease in the life of the relays.

The relay failure detection circuit 300 can acquire inter-relay terminal voltages respectively independently and determine short-circuit failures for the duplexed pair of relays RLa and RLb. Consequently, even when it is determined that a short-circuit failure has occurred in one of the duplexed pair of relays RLa and RLb, by setting the other to the open state, it is possible to cut off the supply of the electric power from the power supply circuit 100 to the motor 20.

B. Second Embodiment

Figure 4:
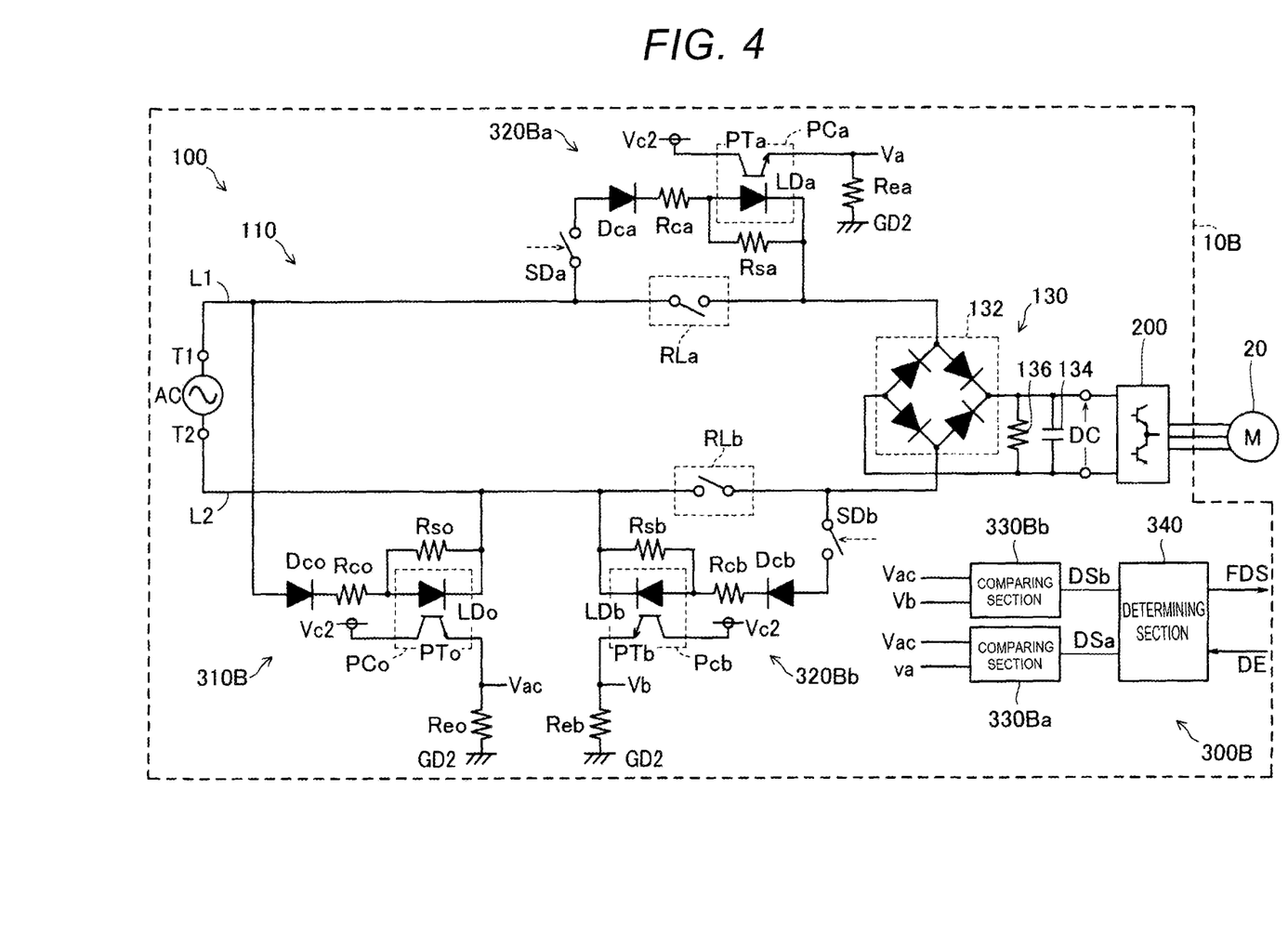
FIG. 4 is a schematic configuration diagram of a control device including a relay failure detection circuit in a second embodiment.

FIG. 4 is a schematic configuration diagram of a control device 10B including a relay failure detection circuit 300B in a second embodiment. The control device 10B in the second embodiment is the same as the control device 10 in the first embodiment except that the relay failure detection circuit 300 of the control device 10 (see FIG. 1) is replaced with the relay failure detection circuit 300B. However, in FIG. 4, the emergency stop circuit 120 and the control section 400 among the components of the power supply circuit 100 are omitted. Since the other components and functions are the same as the components and the functions in the first embodiment, the components and the functions are denoted by reference numerals and signs same as or similar to the reference numerals and signs used in the first embodiment to omit redundant explanation.

The relay failure detection circuit 300B includes an AC-voltage acquiring section 310B, relay-voltage acquiring sections 320Ba and 320Bb, and comparing sections 330Ba and 330Bb instead of the AC-voltage acquiring section 310, the relay-voltage acquiring sections 320a and 320b, and the comparing sections 330a and 330b (see FIG. 1).

The AC-voltage acquiring section 310B includes a diode Dco, an input resistor Rco, and a light emitting diode LDo of a photocoupler PCo coupled in series between the input terminals T1 and T2 and a shunt resistor Rso coupled in parallel to the light emitting diode LDo. The diode Dco and the light emitting diode LDo are coupled to set the first input terminal T1 side as an anode side and set the second input terminal T2 side as a cathode side. The AC-voltage acquiring section 310B includes a phototransistor PTo of the photocoupler PCo and an emitter resistor Reo coupled in series between a ground GD2 and a DC voltage Vc2 and outputs an emitter output as the AC voltage signal Vac. An input-side circuit including the light emitting diode LDo provided between the input terminals T1 and T2 and an output-side circuit including the phototransistor PTo provided between the ground GD2 and the DC voltage Vc2 are insulated.

The AC-voltage acquiring section 310B functions as an AD conversion circuit that converts an analog voltage waveform (a sine waveform) input between the input terminals T1 and T2 into a digital voltage waveform (a rectangular waveform) and outputs the digital voltage waveform as the digital AC voltage signal Vac. The input resistor Rco and the shunt resistor Rso are set according to characteristics of the light emitting diode LDo and the phototransistor PTo such that the light emitting diode LDo is turned on (emits light) and the phototransistor PTo is turned on when the potential of the first input terminal T1 with respect to the second input terminal T2 is high. The input resistor Rco and the shunt resistor Rso are set according to the characteristics of the light emitting diode LDo and the phototransistor PTo such that the light emitting diode LDo is turned off (does not emit light) and the phototransistor PTo is turned off when the potential of the first input terminal T1 with respect to the second input terminal T2 is low.

Like the AC-voltage acquiring section 310B, the first relay-voltage acquiring section 320Ba includes a diode Dca, an input resistor Rca, and a light emitting diode LDa of a photocoupler PCa coupled in series between terminals of the first relay RLa and a shunt resistor Rsa coupled in parallel to the light emitting diode LDa. The diode Dca and the light emitting diode LDa are coupled to set the first input terminal T1 side as an anode side and set the bridge diode 132 side as a cathode side. A detection permission switch SDa is provided on the cathode side of the diode Dca. The first relay-voltage acquiring section 320Ba includes a phototransistor PTa of the photocoupler PCa and an emitter resistor Rea coupled in series between the ground GD2 and the DC voltage Vc2 and outputs an emitter output as the first inter-relay terminal voltage signal Va. An input-side circuit including the light emitting diode LDa provided between the terminals of the first relay RLa and an output-side circuit including the phototransistor PTa provided between the ground GD2 and the DC volage Vc2 are insulated.

The first relay-voltage acquiring section 320Ba functions as an AD conversion circuit that, when the detection permission switch SDa is in the closed state, converts an analog voltage waveform generated between the terminals of the first relay RLa into a digital voltage waveform (a rectangular waveform) and outputs the digital voltage waveform as the digital first inter-relay terminal voltage signal Va. Opening and closing of the detection permission switch SDa is executed according to control by the control section 400 (see FIG. 1). The input resistor Rca and the shunt resistor Rsa are set according to characteristics of the light emitting diode LDa and the phototransistor PTa such that the light emitting diode LDa is turned on (emits light) and the phototransistor PTa is turned on when the potential of the terminal of the first relay RLa on the first input terminal T1 side is high with respect to the potential of the terminal on the opposite side. The input resistor Rca and the shunt resistor Rsa are set according to the characteristics of the light emitting diode LDa and the phototransistor PTa such that the light emitting diode LDa is turned off (does not emit light) and the phototransistor PTa is turned off when the potential of the terminal of the first relay RLa on the first input terminal T1 side is low with respect to the potential of the terminal on the opposite side.

Like the first relay-voltage acquiring section 320a, the second relay-voltage acquiring section 320Bb includes a detection permission switch SDb, a diode Dcb, an input resistor Rcb, and a light emitting diode LDb of a photocoupler PCb coupled in series between terminals of the second relay RLb and a shunt resistor Rsb coupled in parallel to the light emitting diode LDb. The diode Dcb and the light emitting diode LDb are coupled to set the bridge diode 132 side as an anode side and set the second input terminal T2 side as a cathode side. The second relay-voltage acquiring section 320Bb includes a phototransistor PTb of the photocoupler PCb and an emitter resistor Reb coupled in series between the ground GD2 and the DC voltage Vc2 and outputs an emitter output as the second inter-relay terminal voltage signal Vb. An input-side circuit including the light emitting diode LDb provided between the terminals of the second relay RLb and an output-side circuit including the phototransistor PTb provided between the ground GD2 and the DC voltage Vc2 are insulated.

Like the first relay-voltage acquiring section 320Ba, the second relay-voltage acquiring section 320Bb functions as an AD conversion circuit that, when the detection permission switch SDb is in the closed state, converts an analog voltage waveform generated between the terminals of the second relay RLb into a digital voltage waveform and outputs the digital voltage waveform as the digital second inter-relay terminal voltage signal Vb. Opening and closing of the detection permission switch SDb is also executed according to the control by the control section 400 (see FIG. 1). The input resistor Rcb and the shunt resistor Rsb of the input-side circuit are set according to characteristics of the light emitting diode LDb and the phototransistor PTb such that the phototransistor PTb is turned on and off according to a change in a level of a voltage between the terminals of the second relay RLb.

Figure 5:
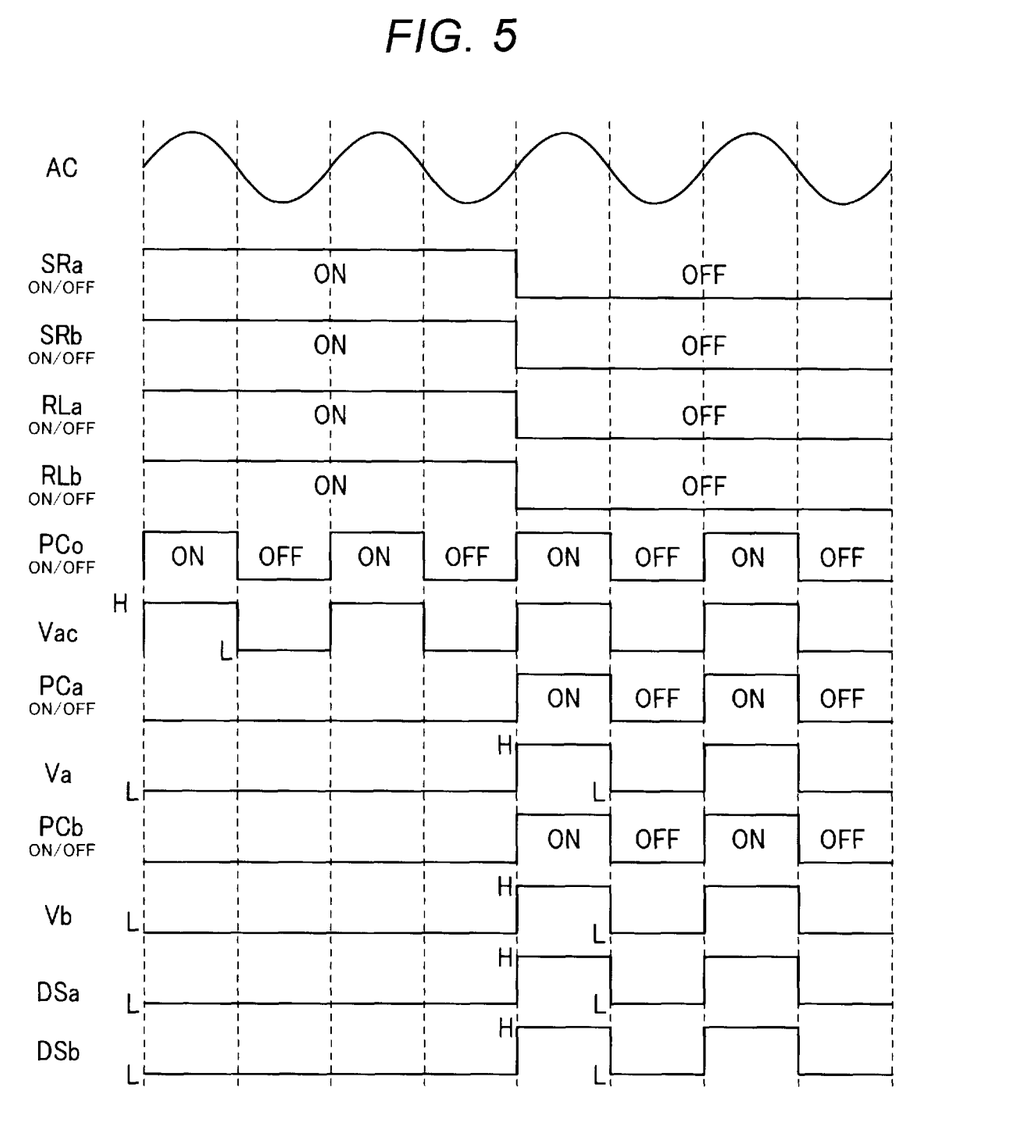
FIG. 5 is an explanatory diagram showing a digital AC voltage signal, digital inter-relay terminal voltage signals, and comparison signals.

FIG. 5 is an explanatory diagram showing the digital AC voltage signal Vac, the digital inter-relay terminal voltage signals Va and Vb, and the comparison signals DSa and DSb in the relay failure detection circuit 300B. The digital AC voltage signal Vac acquired by the AC-voltage acquiring section 310B is a pulse signal that cyclically changes in synchronization with a cyclic change of the AC voltage AC.

The digital first inter-relay terminal voltage signal Va acquired by the first relay-voltage acquiring section 320Ba changes according to a state of the first relay RLa. That is, when the first relay RLa is in the closed state, as explained in the first embodiment (see FIG. 2), since a potential difference does not occur between the terminals of the first relay RLa, the digital first inter-relay terminal voltage signal Va is a fixed signal fixed to a fixed level, in this example, an L (low) level as shown in FIG. 5. In contrast, when the first relay RLa is in the open state, since a potential difference that cyclically changes in synchronization with a cyclic change of the AC voltage signal Vac occurs between the terminals of the first relay RLa (see FIG. 2), the digital first inter-relay terminal voltage signal Va is a pulse signal that cyclically changes in synchronization with a cyclic change of the digital AC voltage signal Vac as shown in FIG. 5.

Therefore, when the first relay RLa is in the open state, if a shift of timing of the cyclic changes of the AC voltage signal Vac and the first inter-relay terminal voltage signal Va is neglected, the AC voltage signal Vac and the first inter-relay terminal voltage signal Va are pulse signals coinciding with each other. When the first relay RLa is in the closed state, the AC voltage signal Vac and the first inter-relay terminal voltage signal Va are noncoinciding signals.

As shown in FIG. 5, the second inter-relay terminal voltage signal Vb is a signal that changes according to a state of the second relay RLb like the change of the first inter-relay terminal volage signal Va corresponding to a state of the first relay RLa.

Accordingly, the first comparing section 330Ba compares the digital AC voltage signal Vac and the digital first inter-relay terminal voltage signal Va and outputs the first comparison signal DSa corresponding to a difference of a comparison result due to a difference of a state of the first relay RLa. Specifically, as shown in FIG. 5, when the first relay RLa is in the open state, the first comparing section 330Ba outputs, as the first comparison signal DSa, a pulse signal that changes coincidentally with changes of the digital AC voltage signal Vac and the digital first inter-relay terminal voltage signal Va. When the first relay RLa is in the closed state, the first comparing section 330Ba outputs, as the first comparison signal DSa, a fixed signal in a fixed level, in this example, the L level.

Like the first comparing section 330Ba, the second comparing section 330Bb outputs the second comparison signal DSb corresponding to a difference of a comparison result due to a difference of a state of the second relay RLb as shown in FIG. 5.

The comparing sections 330Ba and 330Bb operating as explained above can be configured using, for example, a logic circuit called coincidence circuit.

As explained in the first embodiment as well, the determining section 340 can determine short-circuit failures of the first relay RLa and the second relay RLb from states of the first comparison signal DSa and the second comparison signal DSb at the time when the first relay RLa and the second relay RLb are set to the open state.

Figure 6:
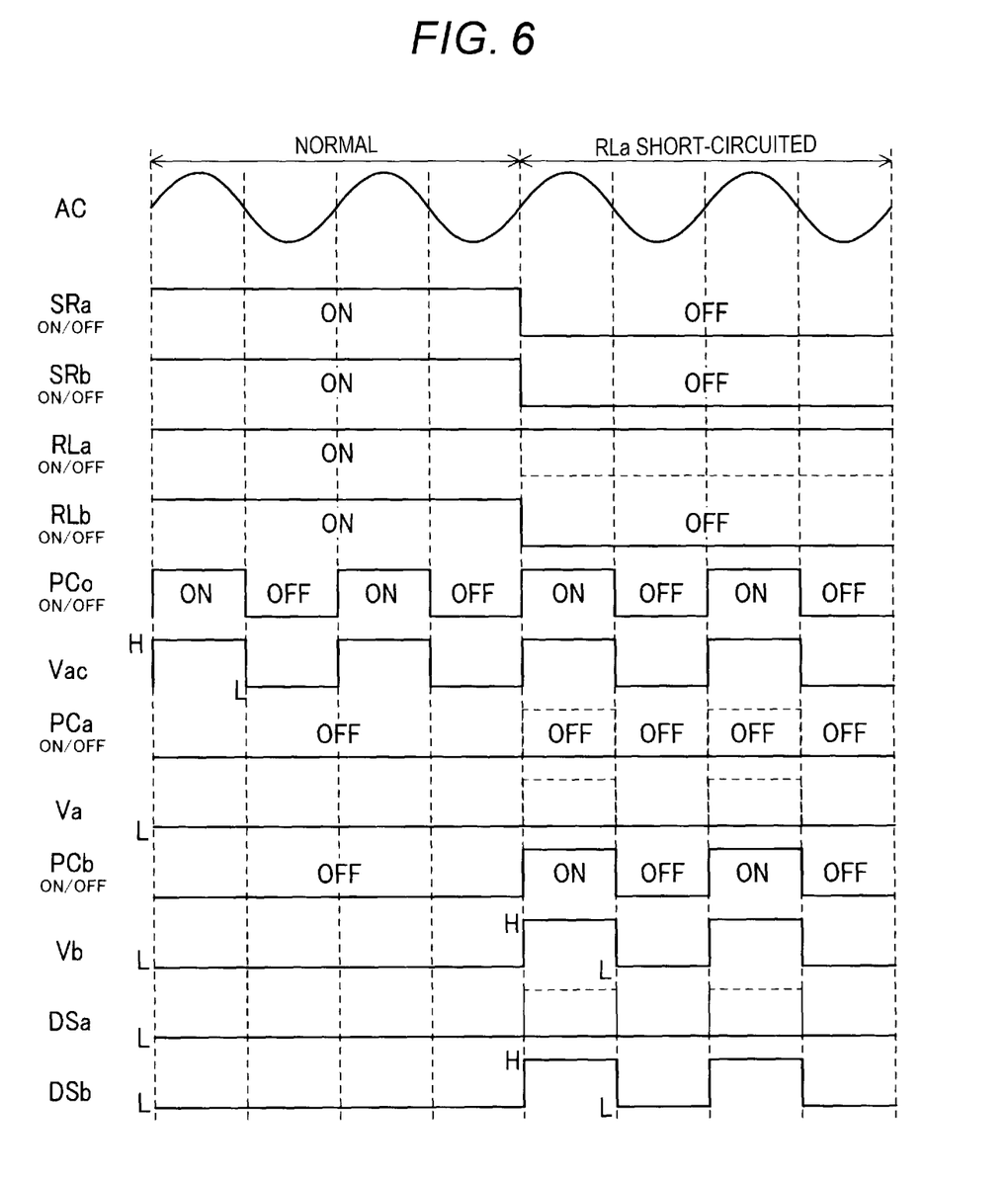
FIG. 6 is an explanatory diagram showing a digital AC voltage signal, digital inter-relay terminal voltage signals, and comparison signals in the case of a short-circuit failure of a first relay.
Figure 7:
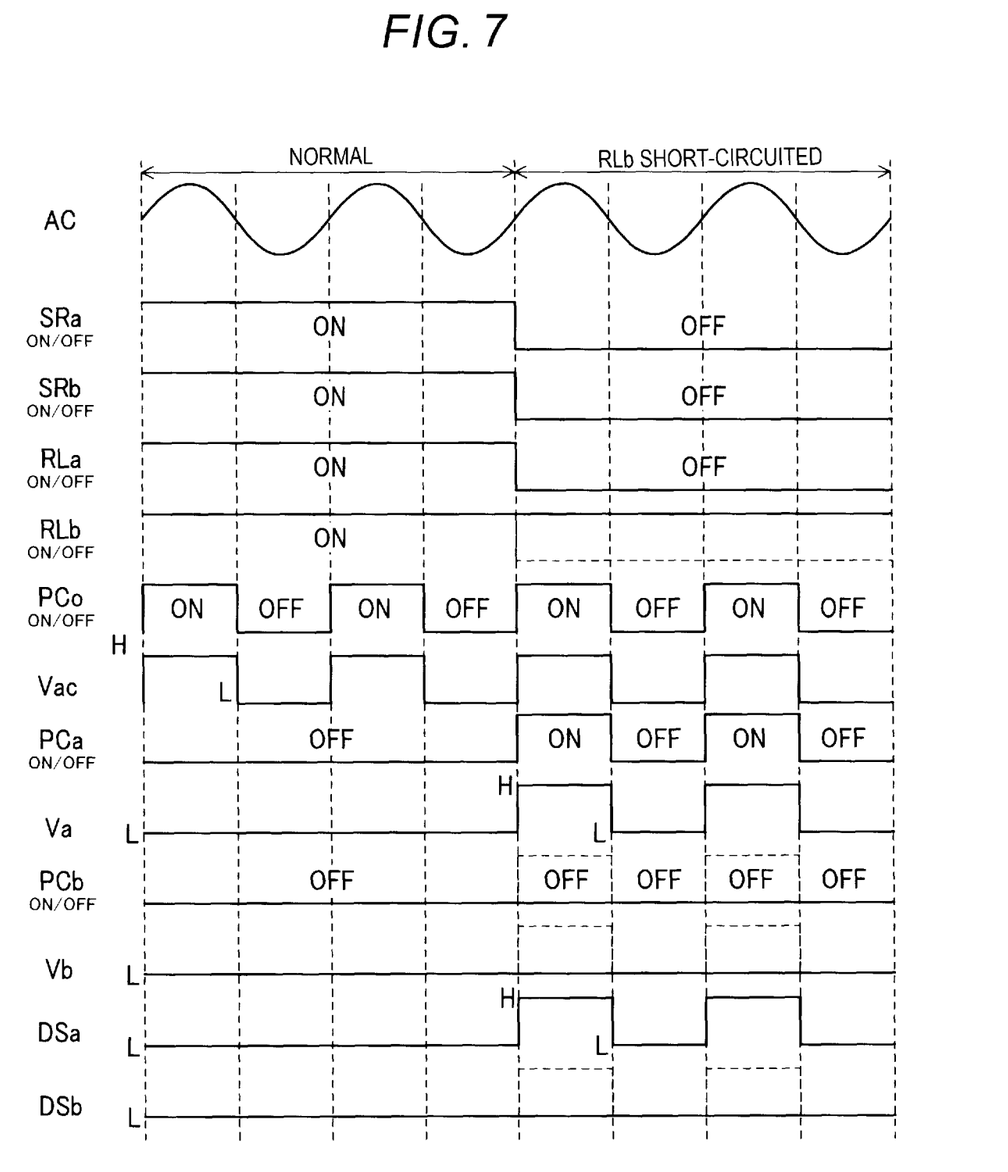
FIG. 7 is an explanatory diagram showing the digital AC voltage signal, the digital inter-relay terminal voltage signals, and the comparison signals in the case of a short-circuit failure of a second relay.

FIG. 6 is an explanatory diagram showing the digital AC voltage signal Vac, the inter-relay terminal voltage signals Va and Vb, and the comparison signals DSa and DSb in the case of a short-circuit failure of the first relay RLa. FIG. 7 is an explanatory diagram showing the digital AC voltage signal Vac, the inter-relay terminal voltage signals Va and Vb, and the comparison signals DSa and DSb in the case of a short-circuit failure of the second relay RLb.

As explained in the first embodiment as well, a state of the short-circuit failure of the first relay RLa is the same as the closed state to which the first relay RLa is set. Therefore, as shown in FIG. 6, even when the first relay RLa is set to the open state, the first comparison signal DSa is a fixed signal. The same applies in the case of the short-circuit failure of the second relay RLb. As shown in FIG. 7, even when the second relay RLb is set to the open state, the second comparison signal DSb is a fixed signal.

Therefore, as explained in the first embodiment as well, the determining section 340 can determine short-circuit failures of the first relay RLa and the second relay RLb from states of the first comparison signal DSa and the second comparison signal DSb at the time when the first relay RLa and the second relay RLb are set to the open state (see FIG. 3).

Therefore, in the relay failure detection circuit 300B in the second embodiment, as in the first embodiment, when the power switches SRa and SRb are set to the open state and the relays RLa and RLb are set to the open state, it is possible to determine short-circuit failures of the relays RLa and RLb by comparing a waveform of the digital AC voltage signal Vac and waveforms of the digital inter-relay terminal voltage signals Va and Vb. In the relay failure detection circuit 300B in the second embodiment as well, even when it is determined that a short-circuit failure has occurred in one of the duplexed pair of relays RLa and RLb, by disabling the power switch of the other relay to be set to the closed state, it is possible to keep the other relay in the open state and it is possible to cut off the supply of the electric power from the power supply circuit 100 to the motor 20.

In the relay failure detection circuit 300B in the second embodiment, only when the detection permission switches SDa and SDb are set to the closed state, it is possible to change the relay-voltage acquiring sections 320Ba and 320Bb from a non-operation state to an operation state, detect inter-terminal voltages of the relays RLa and RLb, and determine short-circuit failures of the relays. For example, by enabling the relay-voltage acquiring sections 320Ba and 320Bb to operate only in a determination permission period set by the determination permission signal DE, it is possible to reduce loads applied to the relay-voltage acquiring sections 320Ba and 320Bb and the comparing sections 330Ba and 330Bb, achieve power saving of the relay failure detection circuit, and achieve power saving of the device.

In the relay failure detection circuit 300B in the second embodiment, the AC voltage signal Vac indicating the AC voltage AC input between the input terminals T1 and T2 and the inter-relay terminal voltage signals Va and Vb indicating inter-terminal voltages of the relays RLa and RLb are the digital voltage waveforms rather than analog voltage waveforms. Consequently, it is possible to suppress deterioration in comparison accuracy according to deterioration in comparison accuracy caused by fluctuation included in an analog voltage waveform, which occurs when the analog voltage waveform is compared as in the first embodiment, and low resolution, perform highly accurate comparison, and perform highly accurate failure detection.

The input-side circuits and the output-side circuits of the AC-voltage acquiring section 310B and the relay-voltage acquiring sections 320Ba and 320Bb are insulated using the photocouplers. Therefore, it is possible to reduce circuit configurations of the AC-voltage acquiring section 310B and the relay-voltage acquiring sections 320Ba and 320Bb in size.

Figure 8:
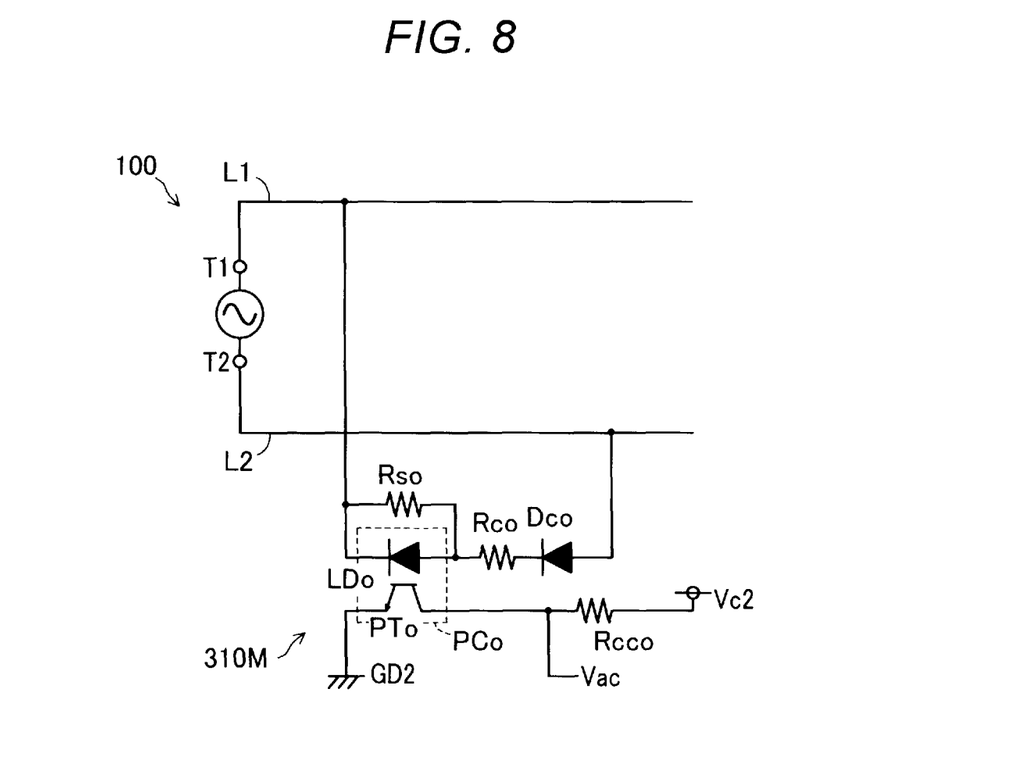
FIG. 8 is a configuration diagram showing an AC-voltage acquiring section having a different connection configuration.

FIG. 8 is a configuration diagram showing an AC-voltage acquiring section 310M having a coupling configuration different from the coupling configuration of the AC-voltage acquiring section 310B. The AC-voltage acquiring section 310B (see FIG. 4) has the configuration in which the anodes of the diode Dco and the light emitting diode LDo are coupled to face the first input terminal T1 side and the cathodes of the diode Doc and the light emitting diode LDo are coupled to face the second input terminal T2 side. In contrast, as shown in FIG. 8, a configuration may be adopted in which the anodes of the diode Dco and the light emitting diode LDo are coupled to face the second input terminal T2 side and the cathodes of the diode Doc and the light emitting diode LDo are coupled to face the first input terminal T1 side. In the case of this configuration, in order to cause the AC-voltage acquiring section 310M to function in the same manner as the AC-voltage acquiring section 310B, a collector resistor Rcco is provided rather than the emitter resistor Reo of the AC-voltage acquiring section 310B. The AC-voltage acquiring section 310M only has to output a collector output as the AC voltage signal Vac.

Although illustration and explanation are omitted, a configuration may be adopted in which the direction of the coupling of the diodes on the input-side circuits of the AC-voltage acquiring section 310 and the relay-voltage acquiring sections 320Ba and 320Bb is opposite to the direction shown in FIG. 4. In this case, this configuration is the same as the configuration of the AC-voltage acquiring section 310B in that the phases of the pulse signals of the AC voltage signal Vac, the inter-relay terminal voltage signals Va and Vb, and the comparison signals DSa and DSb are shifted by a half cycle with respect to the AC volage AC.

C. Third Embodiment

Figure 9:
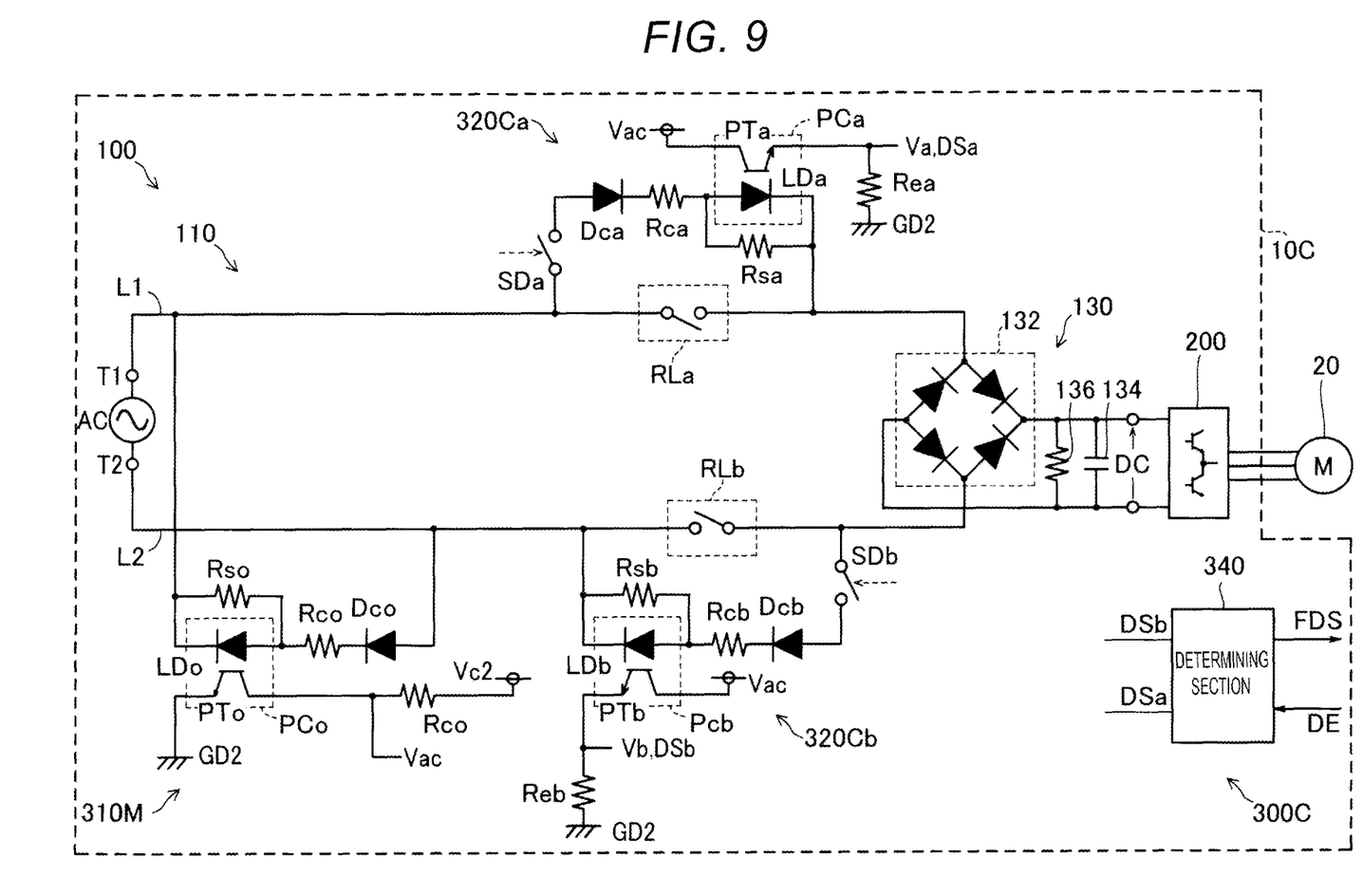
FIG. 9 is a schematic configuration diagram of a control device including a relay failure detection circuit in a third embodiment.

FIG. 9 is a schematic configuration diagram of a control device 10C including a relay failure detection circuit 300C in a third embodiment. The control device 10C in the third embodiment is the same as the control device 10B in the second embodiment except that the relay failure detection circuit 300B of the control device 10B in the second embodiment (see FIG. 4) is replaced with the relay failure detection circuit 300C. In the control device 10C in the third embodiment, the same components and functions as the components and the functions in the first and second embodiments are denoted by reference numerals and signs same as or similar to the reference numerals and signs used in the first and second embodiments to omit redundant explanation.

The relay failure detection circuit 300C includes the AC-voltage acquiring section 310M (see FIG. 8) and relay-voltage acquiring sections 320Ca and 320Cb instead of the AC-voltage acquiring section 310B and the relay-voltage acquiring sections 320Ba and 320Bb (see FIG. 4). The comparing sections 330Ba and 330Bb of the relay failure detection circuit 300B are omitted in the relay failure detection circuit 300C.

The relay-voltage acquiring sections 320Ca and 320Cb are different from the relay-voltage acquiring sections 320Ba and 320Bb only in that the collector sides of the phototransistors PTa and PTb on the output-side circuits of the photocouplers PCa and PCb are coupled to the AC voltage signal Vac output from the AC-voltage acquiring section 310M rather than the DC voltage Vc2.

Figure 10:
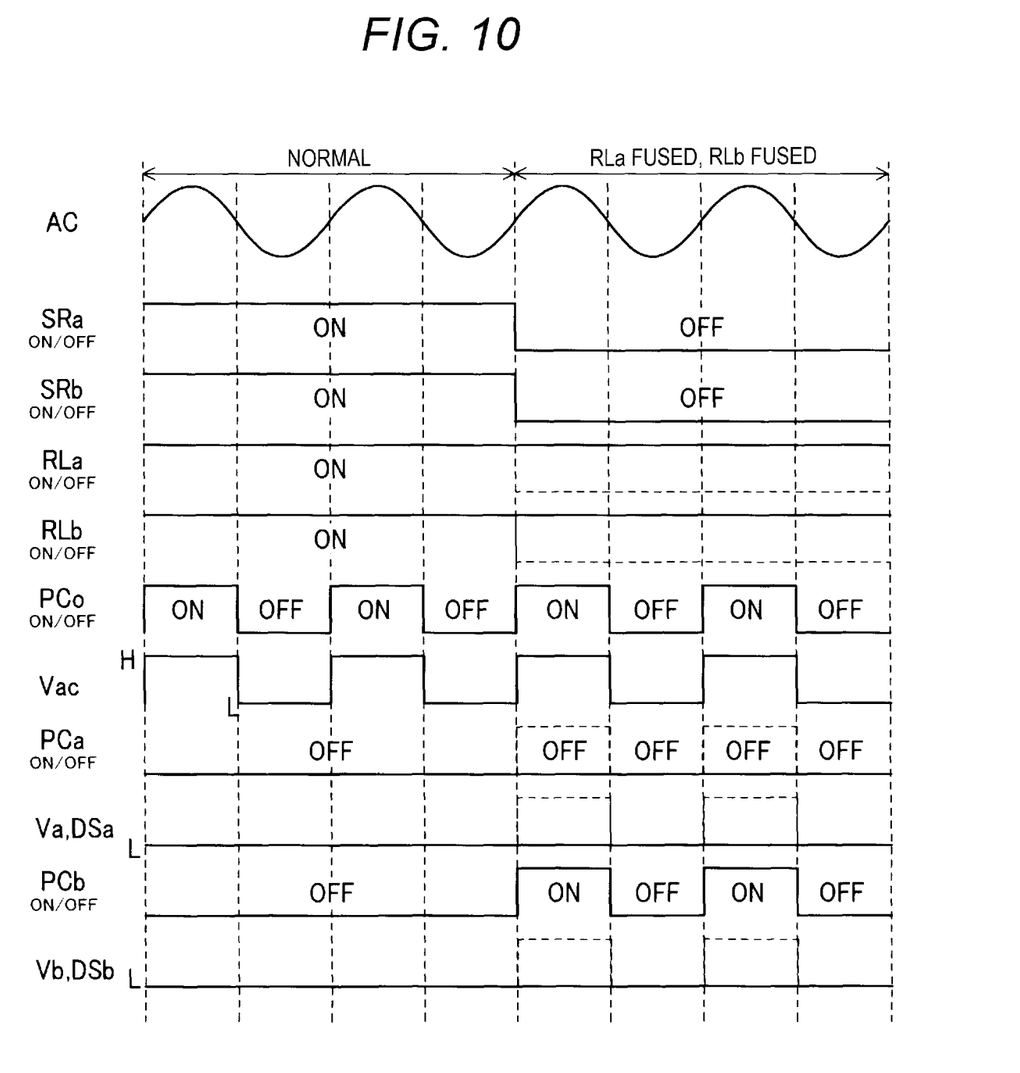
FIG. 10 is an explanatory diagram showing a digital AC voltage signal, digital inter-relay terminal voltage signals, and comparison signals.

FIG. 10 is an explanatory diagram showing the digital AC voltage signal Vac, the digital inter-relay terminal voltage signals Va and Vb, and the comparison signals DSa and DSb in the relay failure detection circuit 300C.

In the relay-voltage acquiring sections 320Ca and 320Cb, as explained above, the collector sides of the phototransistors PTa and PTb are coupled to the AC voltage signal Vac output from the AC-voltage acquiring section 310M rather than the DC voltage Vc2. When the AC voltage signal Vac changes to an H (high) level, the relay-voltage acquiring sections 320Ca and 320Cb are capable of detecting an inter-relay terminal voltage. Therefore, the inter-relay terminal voltage signals Va and Vb are signals equivalent to the comparison signals DSa and DSb in the second embodiment (see FIGS. 5 to 7). That is, the relay-voltage acquiring sections 320Ca and 320Cb also have the functions of the relay-voltage acquiring sections 320Ba and 320Bb and the comparing sections 330Ba and 330Bb (see FIG. 4).

Therefore, in the relay failure detection circuit 300C in the third embodiment, as in the first and second embodiments, when the power switches SRa and SRb are set to the open state and the relays RLa and RLb are set to the open state, it is possible to determine short-circuit failures of the relays RLa and RLb by comparing the waveform of the digital AC voltage signal Vac and the waveforms of the digital inter-relay terminal voltage signals Va and Vb. In the relay failure detection circuit 300C in the third embodiment as well, even when it is determined that a short-circuit failure has occurred in one of the duplexed pair of relays RLa and RLb, by disabling the power switch of the other relay to be set to the closed state, it is possible to keep the other relay in the open state and it is possible to cut off the supply of the electric power from the power supply circuit 100 to the motor 20.

In the relay failure detection circuit 300C in the third embodiment, as in the relay failure detection circuit 300B in the second embodiment, only when the detection permission switches SDa and SDb are set to the closed state, it is possible to change the relay-voltage acquiring sections 320Ca and 320Cb from a non-operation state to an operation state, detect inter-terminal voltages of the relays RLa and RLb, and determine short-circuit failures of the relays. For example, by enabling the relay-voltage acquiring sections 320Ca and 320Cb to operate only in a determination permission period set by the determination permission signal DE, it is possible to reduce loads applied to the relay-voltage acquiring sections 320Ca and 320Cb and achieve power saving of the relay failure detection circuit.

In the relay failure detection circuit 300C in the third embodiment, as in the relay failure detection circuit 300B in the second embodiment, it is possible to suppress deterioration in comparison accuracy according to deterioration in comparison accuracy caused by fluctuation included in an analog voltage waveform, which occurs when the analog voltage waveform is compared as in the first embodiment, and low resolution, perform highly accurate comparison, and perform highly accurate failure detection.

The input-side circuits and the output-side circuits of the AC-voltage acquiring section 310M and the relay-voltage acquiring sections 320Ca and 320Cb are insulated using the photocouplers. Therefore, it is possible to reduce circuit configurations of the AC-voltage acquiring section 310M and the relay-voltage acquiring sections 320Ca and 320Cb in size.

D. Fourth Embodiment

Figure 11:
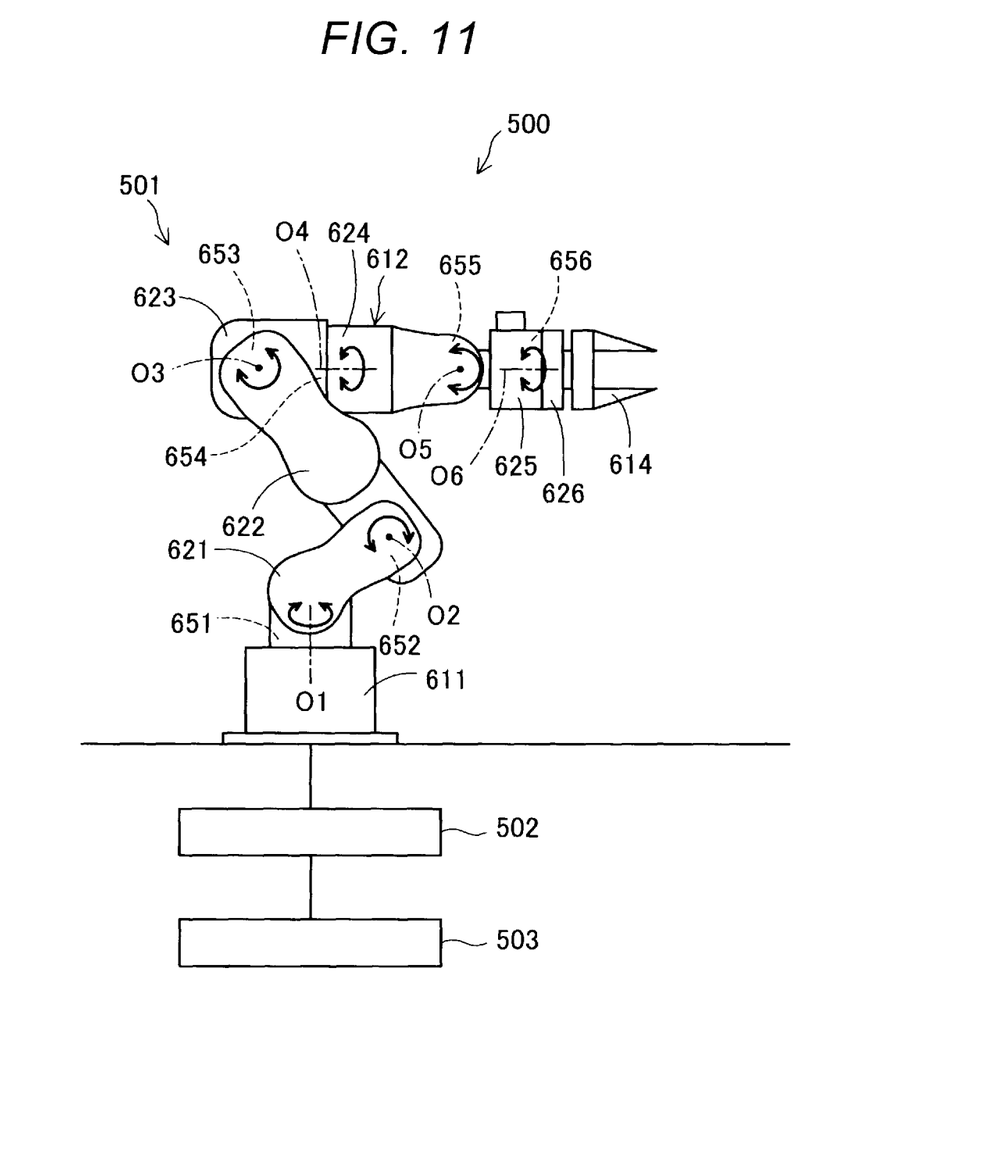
FIG. 11 is a schematic configuration diagram of a robot in a fourth embodiment.

FIG. 11 is a schematic configuration diagram of a robot 500 in a fourth embodiment. The robot 500 includes a robot main body 501 and a control device 502 that controls driving of the robot main body 501. A computer 503 communicable with the control device 502 is coupled to the control device 502. The control device 502 and the computer 503 are communicable by wire or radio. The communication may be performed via a network such as the Internet.

The robot 500 is, for example, a robot that performs work such as supply, removal, conveyance, assembly, and the like of a precision instrument and components configuring the precision instrument. However, a use of the robot 500 is not particularly limited. The robot main body 501 in this embodiment is a six-axis robot and includes, as shown in FIG. 11, a base 611 fixed to a floor or a ceiling and an arm 612 coupled to the base 611.

The arm 612 includes a first arm section 621, a second arm section 622, a third arm section 623, a fourth arm section 624, a fifth arm section 625, and a sixth arm section 626. The first arm section 621 is coupled to the base 611 to be capable of turning around a first axis O1. The second arm section 622 is coupled to the first arm section 621 to be capable of turning around a second axis O2. The third arm section 623 is coupled to the second arm section 622 to be capable of turning around a third axis O3. The fourth arm section 624 is coupled to the third arm section 623 to be capable of turning around a fourth axis O4. The fifth arm section 625 is coupled to the fourth arm section 624 to be capable of turning around a fifth axis O5. The sixth arm section 626 is coupled to the fifth arm section 625 to be capable of turning around a sixth axis O6. A hand 614 corresponding to work to be executed by the robot main body 501 is attached to the sixth arm 626.

The robot main body 501 includes a first driving section 651, a second driving section 652, a third driving section 653, a fourth driving section 654, a fifth driving section 655, and a sixth driving section 656. The first driving section 651 turns the first arm section 621 with respect to the base 611. The second driving section 652 turns the second arm section 622 with respect to the first arm section 621. The third driving section 653 turns the third arm section 623 with respect to the second arm section 622. The fourth driving section 654 turns the fourth arm section 624 with respect to the third arm section 623. The fifth driving section 655 turns the fifth arm section 625 with respect to the fourth arm section 624. The sixth driving section 656 turns the sixth arm section 626 with respect to the fifth arm section 625. The first to sixth driving sections 651 to 656 respectively include motors functioning as driving sources. The first to sixth driving sections 651 to 656 are respectively independently controlled by the control device 502. In the control device 502, a driving circuit that controls driving of the motors of the respective first to sixth driving sections 651 to 656 and a control section that controls the driving circuit are provided.

The robot main body 501 is not limited to the configuration in this embodiment. For example, the number of arms included in the arm 612 may be one to five or may be seven or more. For example, a type of the robot main body 501 may be a SCARA robot or a double-arm robot including two arms 612.

The control device 502 receives an instruction from the computer 503 and respectively independently controls driving of the first to sixth driving sections 651 to 656 to place the arm sections 621 to 626 and the hand 614 in positions corresponding to the instruction. Any one of the control devices 10 to 10C in the embodiments explained above is applied to the control device 502.

In the fourth embodiment, the control device including the relay failure detection circuit in any one of the embodiments is mounted. Therefore, it is possible to, while suppressing deterioration in the life of relays of a power supply circuit that supplies electric power to the motors, which are driving sources of the robot, determine short-circuit failures of the relays and cut off the power supply to the motors.

In the fourth embodiment, a configuration in which the control device 502 is provided on the outside of the robot main body 501 is explained as an example. However, a configuration may be adopted in which the control device 502 is provided on the inside of the robot main body 501. A configuration may be adopted in which a part of the power supply circuit, the driving circuit for the motors, the relay failure detection circuit, and the control section included in the control device 502 is provided on the inside of the robot main body 501.

E. Other Embodiments (1) In the embodiments explained above, as the comparison signals DSa and DSb indicating the result of the comparison of the AC voltage signal Vac equivalent to the first voltage signal and the inter-relay terminal voltage signals Va and Vb equivalent to the second voltage signal, the pulse signals are output when the inter-relay terminal voltage signals Va and Vb coincide with the AC voltage signal Vac and the fixed signals are output when the inter-relay terminal voltage signals Va and Vb do not coincide with the AC voltage signal Vac. However, conversely, a configuration may be adopted in which the fixed signals are output when the inter-relay terminal voltage signals Va and Vb coincide with the AC voltage signal Vac and the pulse signals are output when the inter-relay terminal voltage signals Va and Vb do not coincide with the AC voltage signal Vac.

(2) In the embodiments explained above, the configuration in which, in the AC-voltage acquiring section 310B and the relay-voltage acquiring sections 320Ba, 320Bb, 320Ca, and 320Cb, the input-side circuits that acquire a target voltage and the output-side circuits that output the acquired voltage as a voltage signal are insulated by the photocouplers is explained as an example. However, not only this, but a configuration may be adopted in which the input-side circuits and the output-side circuits are not insulated. The configuration in which the input-side circuits and the output-side circuits are not insulated is not particularly limited if the target voltage can be acquired and the acquired voltage can be output as the voltage signal. Various circuits can be applied as the configuration.

(3) In the control device in the embodiments explained above, when a power failure occurs while the motors, which are the power sources, are driven, in order to prevent a loss of various data used for various controls by the control section or the like, it is preferable to save the data. Accordingly, it is preferable to provide, in the power supply circuit, a power-failure determining section that monitors presence or absence of an input of the AC voltage AC. When an AC voltage is not input for a fixed time, the power-failure determining section only has to determine occurrence of a power failure using the AC voltage signal Vac output from the AC-voltage acquiring sections 310, 310B, and 310M in the embodiments. Consequently, a part of the power-failure determining section can be used as the AC-voltage acquiring section as well. Therefore, it is possible to suppress an increase in the size of the device.

(4) In the embodiments explained above, the power supply circuit 100 includes the duplexed pair of relays RLa and RLb and determines short-circuit failures of the respective relays. However, the power supply circuit 100 may include one relay and determine a short-circuit failure of the relay.

(5) In the embodiments explained above, the relay failure detection circuit that determines short-circuit failures of the relays of the power supply circuit mounted on the control device that controls the driving of the motors functioning as the power sources is explained as an example. However, not only this, but the relay failure detection circuit can be applied as a relay failure detection circuit that detects short-circuit failures of relays of a power supply circuit to which AC power is input.

F. Other Aspects

The present disclosure is not limited to the embodiments explained above and can be realized in various configurations in a range not departing from the gist of the present disclosure. For example, technical features of the embodiments corresponding to technical features in aspects described below can be substituted or combined as appropriate in order to solve a part or all of the problems described above or achieve a part or all of the effects described above. Unless the technical features are explained as essential technical features in this specification, the technical features can be deleted as appropriate.

(1) According to a first aspect of the present disclosure, there is provided a relay failure detection circuit. The relay failure detection circuit includes: a first voltage acquiring section configured to acquire an AC voltage input to a power supply circuit and output the AC voltage as a first voltage signal; a second voltage acquiring section configured to acquire an inter-terminal voltage of a relay provided in the power supply circuit and output the inter-terminal voltage as a second voltage signal; a comparing section configured to compare waveforms of the first voltage signal and the second voltage signal; and a determining section configured to determine a failure of the relay according to a result of the comparison of the waveforms.

With such a relay failure detection circuit according to the aspect, it is possible to suppress the number of times of on/off switching of the relay and determine a short-circuit failure of the relay.

(2) In the aspect, the determining section may detect the failure of the relay when a difference between the waveform of the first voltage signal and the waveform of the second voltage signal is equal to or larger than a predetermined threshold.

According to this aspect, it is possible to determine the failure of the relay in a state of the relay set to an open state.

(3) In the aspect, the first voltage acquiring section and the second voltage acquiring section may respectively include digital conversion circuits including photocouplers. The first voltage signal may be a digital signal indicating a change in the AC voltage. The second voltage signal may be a digital signal indicating a change in the inter-terminal voltage of the relay.

According to this aspect, it is possible to highly accurately compare the first voltage signal and the second voltage signal and perform highly accurate failure detection. Since an input-side circuit that acquires a voltage and an output-side circuit that outputs a voltage signal are insulated using the photocouplers, it is possible to reduce the configuration of the first voltage acquiring section and the second voltage acquiring section in size.

(4) In the aspect, the comparing section may compare the waveforms when an energization switch for supplying electric power to a coil of the relay is in an open state.

According to this aspect, it is possible to determine the failure of the relay without performing switching of the relay.

(5) In the aspect, the first voltage signal may be used for determination of occurrence of a stop of the input of the AC voltage in a power-failure determining section of the power supply circuit.

According to this aspect, it is possible to use a part of the power-failure determining section as an AC-voltage acquiring section as well. Therefore, it is possible to suppress an increase in the size of a device.

(6) In the aspect, when a predetermined time elapses, the comparing section may compare the waveforms, and the determining section may determine the failure of the relay.

According to this aspect, compared with when the determination is always performed, it is possible to achieve power saving of a device including the relay failure detection circuit.

(7) In the aspect, the second-voltage acquiring section may include a switch for switching propriety of acquisition of the inter-terminal voltage, and, when the failure of the relay is determined, the switch may be set to a closed state to output the second voltage signal.

According to this aspect, it is possible to reduce a load applied to the second voltage acquiring section, achieve power saving of the relay failure detection circuit, and achieve power saving of the device.

(8) In the aspect, the relay may be duplexed as a pair of the relays and provided in the power supply circuit, the relay failure detection circuit may include a pair of the second voltage acquiring sections and a pair of the comparing sections for the respective duplexed relays, and the determining section may determine failures of the respective relays according to respective results of the comparison of the waveforms and, when the failure of one of the relays is determined, set another relay to an open state.

According to this aspect, even when the failure is determined in one relay of the duplexed relays, by setting the other relay to the open state, it is possible to cut off the electric power output from the power supply circuit.

(9) According to a second aspect of the present disclosure, there is provided a robot. The robot includes: a motor functioning as a power source; a power supply circuit configured to supply electric power for driving the motor; and the relay failure detection circuit in the first aspect.

According to this aspect, it is possible to, while suppressing deterioration in the life of the relay of the power supply circuit that supplies electric power of the motor, which is the power source of the robot, determine a failure of the relay, and cut off the power supply to the motor.

What is claimed is:
1. A relay failure detection circuit comprising:
  a first voltage acquiring section configured to acquire an AC voltage input to a power supply circuit and output the AC voltage as a first voltage signal;
  a second voltage acquiring section configured to acquire an inter-terminal voltage of a relay provided in the power supply circuit and output the inter-terminal voltage as a second voltage signal;
  a comparing section configured to compare a waveform of the first voltage signal and a waveform of the second voltage signal; and
  a determining section configured to determine a failure of the relay according to a result of the comparison.

2. The relay failure detection circuit according to claim 1, wherein the determining section detects the failure of the relay when a difference between the waveform of the first voltage signal and the waveform of the second voltage signal is equal to or larger than a predetermined threshold.

3. The relay failure detection circuit according to claim 1, wherein
the first voltage acquiring section and the second voltage acquiring section respectively include digital conversion circuits including photocouplers, and
the first voltage signal is a digital signal indicating a change in the AC voltage, and the second voltage signal is a digital signal indicating a change in the inter-terminal voltage of the relay.

4. The relay failure detection circuit according to claim 1, wherein the comparing section performs the comparison when an energization switch for supplying electric power to a coil of the relay is in an open state.

5. The relay failure detection circuit according to claim 1, wherein the first voltage signal is used for determining, in a power-failure determining section of the power supply circuit, whether the input of the AC voltage is stopped.

6. The relay failure detection circuit according to claim 1, wherein, when a predetermined time elapses, the comparing section performs the comparison, and the determining section determines the failure of the relay.

7. The relay failure detection circuit according to claim 6, wherein the second-voltage acquiring section includes a switch for switching whether to acquire the inter-terminal voltage, and, when the failure of the relay is determined, outputs the second voltage signal when the switch is in a closed state.

8. The relay failure detection circuit according to claim 1, wherein
the relay is duplexed as a pair of the relays and provided in the power supply circuit,
the relay failure detection circuit includes a pair of the second voltage acquiring sections and a pair of the comparing sections for the respective duplexed relays, and
the determining section determines failures of the respective relays according to respective results of the comparison and, when the failure of one of the relays is determined, set another relay to an open state.

9. A robot comprising:
a motor functioning as a power source;
a power supply circuit configured to supply electric power for driving the motor; and
the relay failure detection circuit according to claim 1.

* * * * *